(12) United States Patent
Hayashi et al.

(10) Patent No.: US 10,594,331 B2
(45) Date of Patent: Mar. 17, 2020

(54) ANALOG-TO-DIGITAL CONVERSION DEVICE

(71) Applicant: SANKEN ELECTRIC CO., LTD., Niiza-Shi, Saitama (JP)

(72) Inventors: Hideki Hayashi, Niiza (JP); Yoshitaka Takemoto, Niiza (JP)

(73) Assignee: SANKEN ELECTRIC CO., LTD., Niiza-shi (JP)

( * ) Notice: Subject to any disclaimer, the term of this patent is extended or adjusted under 35 U.S.C. 154(b) by 0 days.

(21) Appl. No.: 16/395,286

(22) Filed: Apr. 26, 2019

(65) Prior Publication Data

US 2019/0253064 A1 Aug. 15, 2019

Related U.S. Application Data

(63) Continuation of application No. PCT/JP2016/085257, filed on Nov. 29, 2016.

(51) Int. Cl.
*H03M 1/12* (2006.01)

(52) U.S. Cl.
CPC .............. *H03M 1/122* (2013.01); *H03M 1/12* (2013.01)

(58) Field of Classification Search
CPC ........ H03M 1/122; H03M 1/12; H03M 1/001; H03M 1/004; H03M 1/02; H03M 1/10; H03M 1/00

(Continued)

(56) References Cited

U.S. PATENT DOCUMENTS 5,008,901 A * 4/1991 Wallach ................. H04L 5/143
370/282
5,168,276 A * 12/1992 Huston ..................... G06F 3/05
341/141

(Continued)

FOREIGN PATENT DOCUMENTS

JP S59-211132 A 11/1984
JP H08-149400 A 6/1996

(Continued)

*Primary Examiner* — Jean B Jeanglaude
(74) *Attorney, Agent, or Firm* — Metrolex IP Law Group, PLLC (57) ABSTRACT

An analog-to-digital conversion device according to one or more embodiments independently executes each of events instructed by a host device. Each of two or more analog-to-digital converters include an execution control unit, an event management unit that notifies of a synchronization instruction when a synchronous conversion event set up with a synchronous conversion operation is instructed as the event, and an operation control unit. When a particular one of the analog-to-digital converters receives the synchronization instruction and the execution control unit of the particular analog-to-digital converter is confirmed ready for the analog-to-digital conversion, the operation control unit in the particular analog-to-digital converter notifies the particular analog-to-digital converter is ready for the analog-to-digital conversion to the analog-to-digital converter other than the particular analog-to-digital converter, and instructs the execution control unit to execute the synchronous conversion event after a confirmation that all of the analog-to-digital converters are ready for the analog-to-digital conversion.

4 Claims, 5 Drawing Sheets

(58) Field of Classification Search
USPC .......................................................... 341/155
See application file for complete search history.

(56) References Cited

U.S. PATENT DOCUMENTS

| | | | |
|---|---|---|---|
| 6,788,235 B1 | 9/2004 | Barrenscheen et al. | |
| 2007/0103357 A1* | 5/2007 | Alfano | G06F 1/08 |
| | | | 341/155 |
| 2015/0207445 A1* | 7/2015 | Yasuda | H02P 29/032 |
| | | | 318/400.04 |

FOREIGN PATENT DOCUMENTS

| | | |
|---|---|---|
| JP | 2002-527977 A | 8/2002 |
| JP | 2005-303575 A | 10/2005 |

* cited by examiner

| EVENT | PRIORITY | ADC11 | ADC12 |
|---|---|---|---|
| 「0」 | 1 | CH_0 | CH_1 |
| 「1」 | 2 | CH_3 ~ CH_7 | — |
| 「2」 | 3 | — | CH_8 ~ CH_10 |
| 「3」 | 4 | CH_11 ~ CH_15 | CH_16 ~ CH_17 |
| 「4」 | 5 | — | CH_8 ~ CH_10 |

ANALOG-TO-DIGITAL CONVERSION DEVICE

CROSS REFERENCE TO RELATED APPLICATIONS

This application is a continuation application of International Application No. PCT/JP2016/085257, filed on Nov. 29, 2016, entitled "ANALOG-TO-DIGITAL CONVERSION DEVICE", which claims priority based on the Article 8 of Patent Cooperation Treaty, the entire contents of which are incorporated herein by reference.

BACKGROUND

This disclosure relates to an analog-to-digital (AD) conversion device that performs AD conversion by converting analog signals into digital signals.

It is inefficient to provide an AD converter for each of many analog signal inputs in a case of performing AD conversion by converting the many analog signals into digital signals. As such, Japanese Patent Application Publication No. 2005-303575 (Patent Document 1) discloses a configuration to perform AD conversion by assigning one AD converter to two or more analog signal inputs while selecting the analog signal inputs from one to another.

SUMMARY

One or more embodiments of analog-to-digital conversion device that independently executes each of events instructed by a host device may include: at least two analog-to-digital converters that convert an inputted analog signal into a digital signal, wherein each of the analog-to-digital converters independently executes an event instructed by the host device, wherein each of the analog-to-digital converters may include: an execution control unit that controls execution of the analog-to-digital conversion; an event management unit that notifies of a synchronization instruction when a synchronous conversion event set up with a synchronous conversion operation is instructed as the event; and an operation control unit that makes a notification to the analog-to-digital converters, and instructs the execution control unit to execute the synchronous conversion event, wherein when a particular one of the analog-to-digital converters receives the synchronization instruction and the execution control unit of the particular analog-to-digital converter is confirmed ready for the analog-to-digital conversion, the operation control unit in the particular analog-to-digital converter notifies the particular analog-to-digital converter is ready for the analog-to-digital conversion to the analog-to-digital converter other than the particular analog-to-digital converter, and instructs the execution control unit to execute the synchronous conversion event after a confirmation that all of the analog-to-digital converters are ready for the analog-to-digital conversion.

In one or more analog-to-digital conversion device, in a state where the synchronization instruction is not notified due to a reason that the event is not the synchronous conversion event, when the operation control unit of the particular analog-to-digital converter confirms that the execution control unit of the particular analog-to-digital converter is ready for the analog-to-digital conversion, the operation control unit may instruct the execution control unit to execute the event without notifying the other analog-to-digital converter that the particular analog-to-digital converter is ready for the analog-to-digital conversion.

In one or more analog-to-digital conversion device, the synchronous conversion event may be set as a top priority among all of the events, and the event management unit may execute the synchronous conversion event on a priority basis when events including the synchronous conversion event are in a standby state.

DETAILED DESCRIPTION

Embodiments are explained with reference to drawings. In the respective drawings referenced herein, the same constituents are designated by the same reference numerals and duplicate explanation concerning the same constituents is basically omitted. All of the drawings are provided to illustrate the respective examples only. No dimensional proportions in the drawings shall impose a restriction on one or more embodiments. For this reason, specific dimensions and the like should be interpreted with the following descriptions taken into consideration. In addition, the drawings may include parts whose dimensional relationship and ratios are different from one drawing to another.

Figure 1:
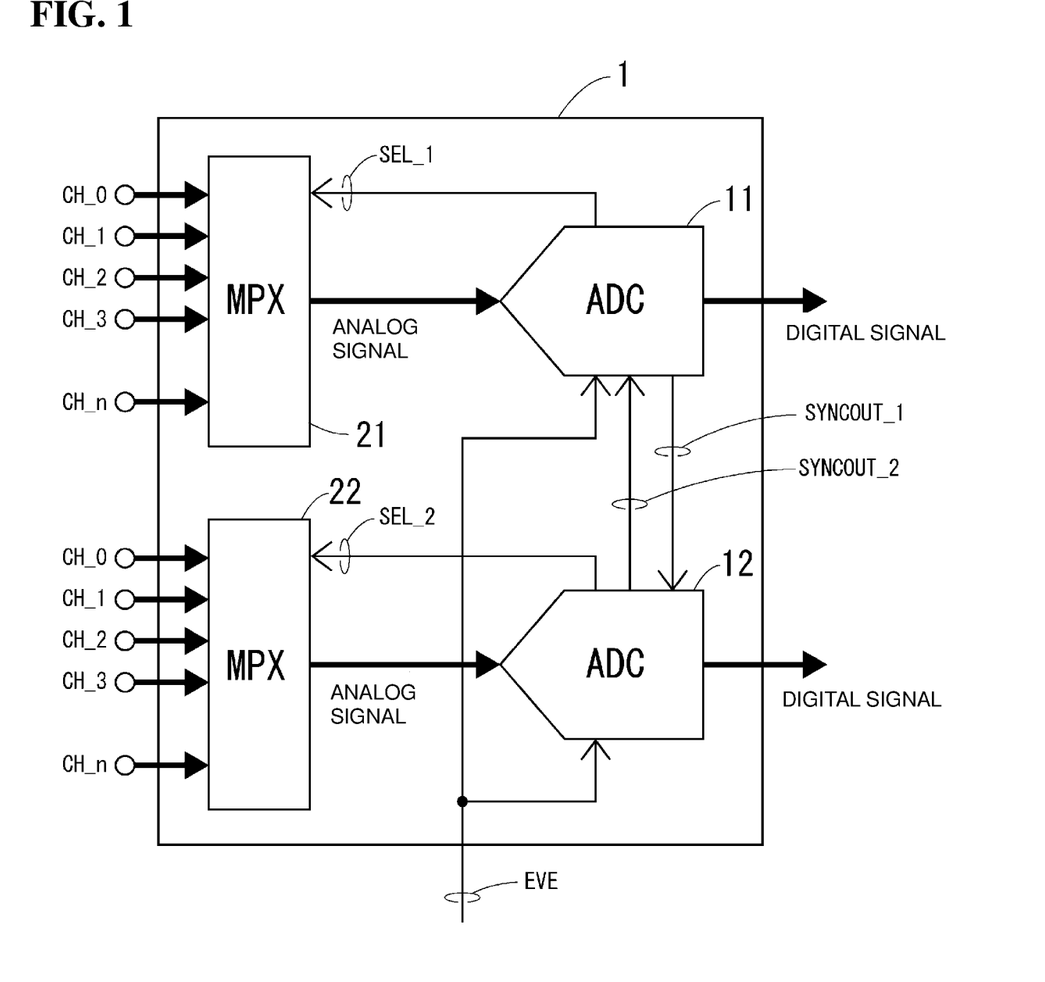
FIG. 1 is a diagram illustrating a circuit configuration of an AD conversion device according to one or more embodiments.

Referring to FIG. 1, an analog-to-digital (AD) conversion device 1 according to one or more embodiments include: two AD converters (ADC) 11 and 12 each of which converts an inputted analog signal into a digital signal; a selector (MPX) 21 that selects the analog signal to be inputted to the ADC 11; and a selector (MPX) 22 that selects the analog signal to be inputted to the ADC 12. Moreover, the ADC 11 and 12 as well as the MPX 21 and 22 are operated in accordance with sampling blocks of a predetermined cycle (a sampling cycle).

Each of the ADC 11 and 12 performs AD conversion by converting an analog signal that corresponds to an event designated by an event signal EVE inputted from a not-illustrated host device into a digital signal. The event signal EVE designates one of events that are set up with priorities. Meanwhile, each event is set up with analog input or inputs to be subjected to the AD conversion by the ADC 11 and 12 out of analog inputs CH_0 to CH_n connected to the MPX 21 and 22. In this embodiment, the same analog inputs CH_0 to CH_n are assumed to be connected to the MPX 21 and 22 for the convenience of explanation. However, the analog inputs CH to be connected to the MPX 21 and the MPX 22 may be determined separately as desired.

Figure 2:
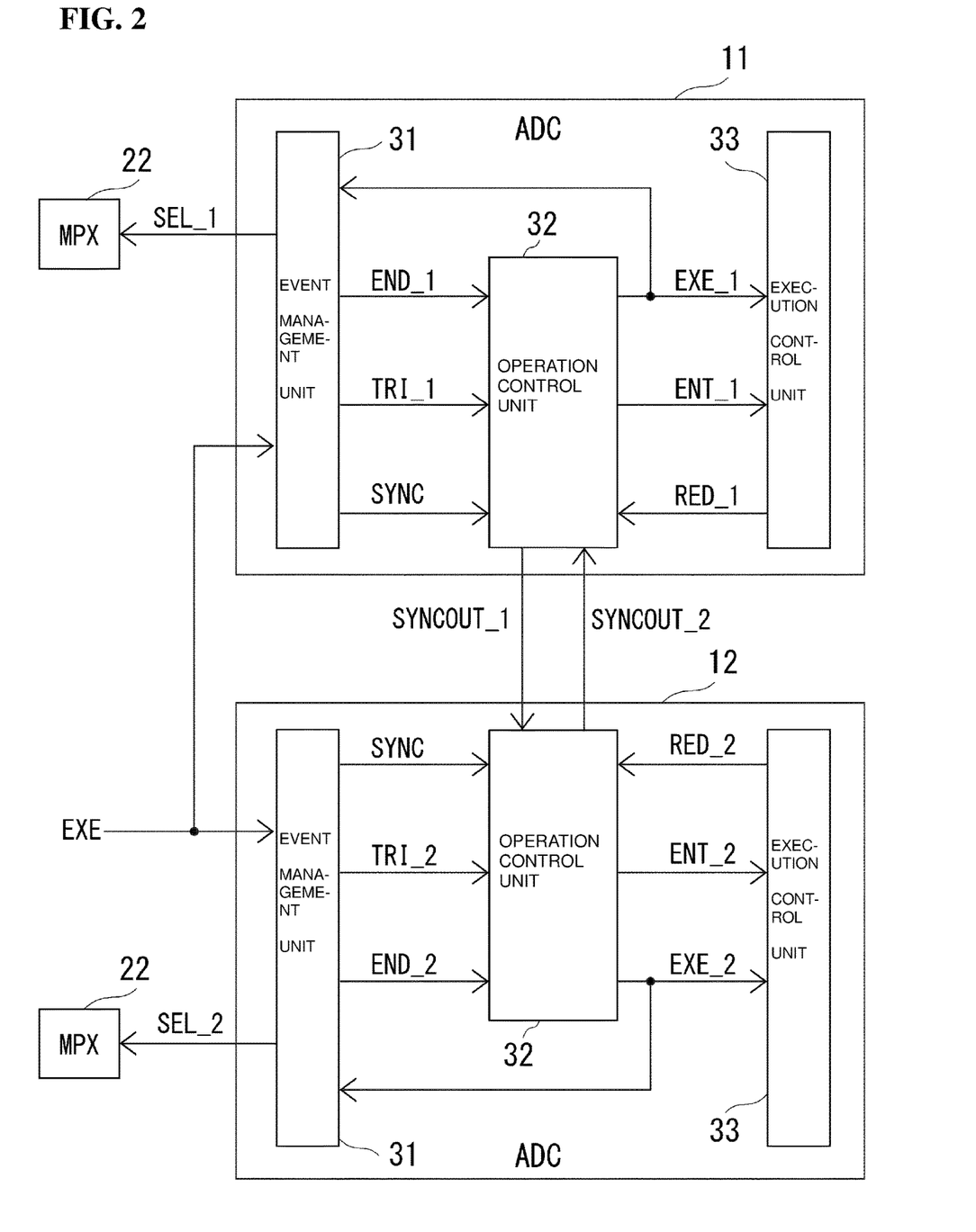
FIG. 2 is a view illustrating circuit configurations of AD converters illustrated in FIG. 1 according to one or more embodiments.

Referring to FIG. 2, each of the ADC 11 and 12 includes an event management unit 31 that manages an operation of each event designated by the event signal EVE, an operation control unit 32 that controls a timing to start the AD conversion, and an execution control unit 33 that controls execution of the AD conversion.

Figure 3:
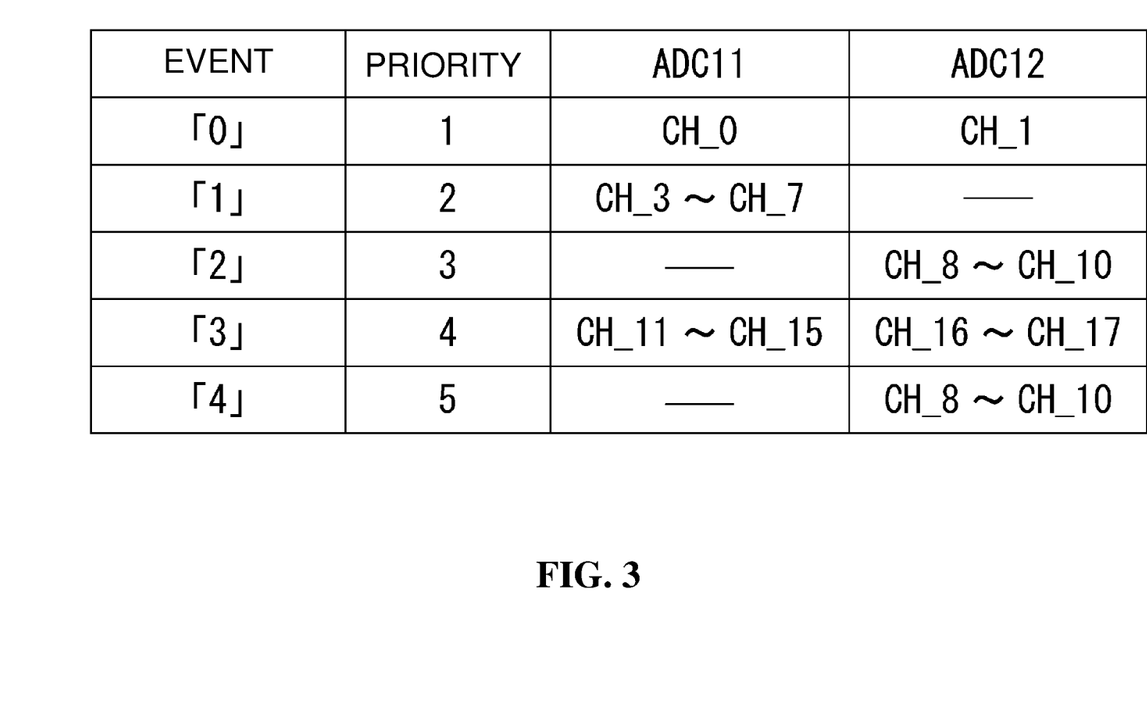
FIG. 3 is a diagram illustrating an event correspondence table stored in an event management unit illustrated in FIG. 2.

An event correspondence table as illustrated in FIG. 3 is set to the event management unit 31. Here, the priorities of the events (events "0" to "4") to be designated by the event signal EVE, and the analog input or inputs among the analog inputs CH_0 to CH_n connected to the MPX 21 and 22 to be subjected to the AD conversion by the ADC 11 and 12 are set up in the event correspondence table. Here, in the event correspondence table illustrated in FIG. 3, the event "0" is set as a top priority where the analog input CH_0 is set to be subjected to the AD conversion by the ADC 11 while the analog input CH_1 is set to be subjected to the AD conversion by the ADC 12, respectively.

When the event signal EVE is inputted, the event management unit 31 refers to the event correspondence table to determine whether or not there is assignment of analog input or inputs CH to be subjected to the AD conversion, and outputs a trigger signal TRI to the operation control unit 32.

The AD conversion device 1 is operated independently of the host device. Accordingly, the event signal EVE from the host device may be inputted to the event management unit 31 even when another event is in execution, whereby two or more events may be put into a standby state. In this case, after the event in execution is completed, the event management unit 31 subsequently causes the AD conversion device 1 to execute the event with the top priority among the events in the standby state. Incidentally, the trigger signal TRI is a signal that notifies of existence of the event to be executed next. Accordingly, if one or more events are in the standby state and the event signal EVE is inputted, the trigger signal TRI is outputted after the event in execution is completed.

When the trigger signal TRI is inputted, the operation control unit 32 outputs an entry signal ENT to the execution control unit 33. When the execution control unit 33 gets ready for the AD conversion in response to the entry signal ENT, the execution control unit 33 outputs a ready signal RED to the operation control unit 32. The entry signal ENT is a signal to request the execution control unit 33 to get ready for execution of the AD conversion, and a state of output of the entry signal ENT is maintained until the ready signal RED is inputted from the execution control unit 33.

When the ready signal RED is inputted, the operation control unit 32 outputs an execution signal EXE for instructing execution of the AD conversion to the event management unit 31 and to the execution control unit 33. In response thereto, the event management unit 31 selects the analog input or inputs by using a selection signal SEL while the execution control unit 33 performs the AD conversion by converting the analog signals from the analog inputs selected by the event management unit 31 serially into digital signals. Here, when the event management unit 31 selects the final analog input during the event in execution, the event management unit 31 outputs an end signal END to the operation control unit 32 so as to cause the operation control unit 32 to stop outputting the execution signal EXE.

The event "0" of the top priority is set to a synchronous conversion operation in which converted values by the ADC 11 and the ADC 12 are synchronized to the same hour. Here, each of the ADC 11 and 12 acquires a value during execution of conversion processing by saving a voltage into an inner capacitor and measuring the voltage in the capacitor. For this reason, in order to synchronize the converted values by the ADC 11 and the ADC 12 to the same hour, it is only necessary to start saving the voltages by the ADC 11 and the ADC 12 at the same hour. Hence, the synchronous conversion operation is controlled such that the AD conversion by the ADC 11 and by the ADC 12 is started at the same hour.

Figure 4:
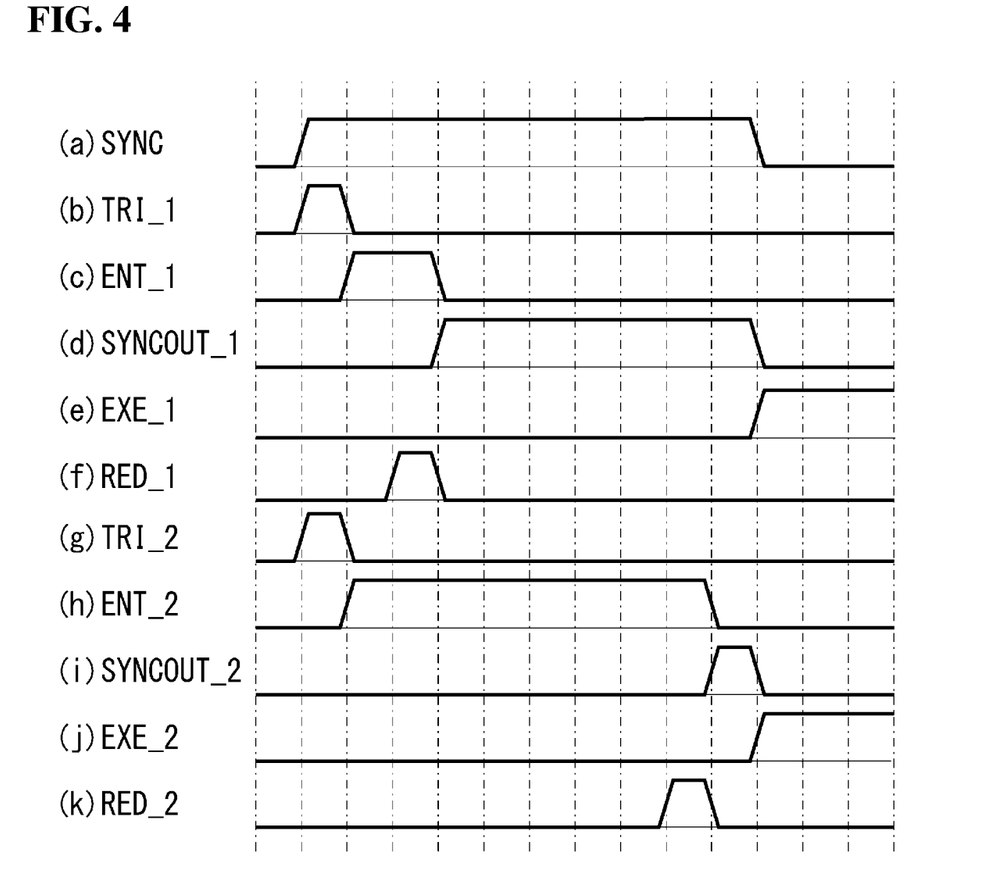
FIG. 4 is a waveform diagram illustrating a synchronous conversion operation by the AD conversion device according to one or more embodiments.

Next, the synchronous conversion operation by the AD conversion device 1 is described with reference to FIG. 4. In FIG. 4, line (a) indicates a synchronization instruction signal SYNC outputted from the event management unit 31 of each of the ADC 11 and the ADC 12, line (b) indicates a trigger signal TRI_1 outputted from the event management unit 31 of the ADC 11, line (c) indicates an entry signal ENT_1 outputted from the operation control unit 32 of the ADC 11, line (d) indicates a synchronized output signal SYNCOUT_1 outputted from the operation control unit 32 of the ADC 11, line (e) indicates an execution signal EXE_1 outputted from the operation control unit 32 of the ADC 11, line (f) indicates ready signal RED_1 outputted from the execution control unit 33 of the ADC 11, line (g) indicates a trigger signal TRI_2 outputted from the event management unit 31 of the ADC 12, line (h) indicates an entry signal ENT_2 outputted from the operation control unit 32 of the ADC 12, line (i) indicates a synchronized output signal SYNCOUT_2 outputted from the operation control unit 32 of the ADC 12, line (j) indicates an execution signal EXE_2 outputted from the operation control unit 32 of the ADC 12, and line (k) indicates a ready signal RED_2 outputted from the execution control unit 33 of the ADC 12, respectively.

When the event "0" is designated by the inputted event signal EVE, the event management unit 31 of each of the ADC 11 and the ADC 12 changes the synchronization instruction signal SYNC to a high level and instructs the operation control unit 32 to execute the synchronous conversion operation. Meanwhile, as illustrated in FIG. 2, the analog input CH_0 is assigned to the ADC 11 and the analog input CH_1 is assigned to the ADC 12 in the event "0", respectively. Accordingly, the respective event management units 31 of the ADC 11 and the ADC 12 notify of the existence of the event to be executed by setting the trigger signal TRI_1 and the trigger signal TRI_2 to a high level for a predetermined period, respectively.

In response to the input of the trigger signal TRI_1 and the trigger signal TRI_2, the operation control units 32 of the ADC 11 and the ADC 12 request the execution control units 33 to get ready for execution of the AD conversion by changing the entry signal ENT_1 and the entry signal ENT_2 to a high level, respectively.

Here, if the ADC 11 is in the state of standby without executing another event, the execution control unit 33 of the ADC 11 changes the ready signal RED_1 to a high level for a predetermined period in response to the input of the entry signal ENT_1, thereby notifying the operation control unit 32 that the execution control unit 33 is ready.

After receiving the input of the ready signal RED_1, the operation control unit 32 of the ADC 11 instructs the event management unit 31 and the execution control unit 33 to execute the AD conversion by changing the execution signal EXE to a high level in the case of an ordinary operation where the synchronization instruction signal SYNC is at a low level. On the other hand, in the case of the synchronous conversion operation where the synchronization instruction signal SYNC is at a high level, the operation control unit 32 notifies the operation control unit 32 of the ADC 12 that the ADC 11 is ready for the AD conversion by changing the synchronized output signal SYNCOUT_1 to a high level.

In the meantime, when the ADC 12 is executing another event, the execution control unit 33 of the ADC 12 inputs the entry signal ENT_2 and then notifies the operation control unit 32 that the execution control unit 33 is ready by changing the ready signal RED_2 to a high level for a predetermined period after completion of the event in execution.

In the synchronous conversion operation where the synchronization instruction signal SYNC is at a high level, the operation control unit 32 of the ADC 12 having received the input of the ready signal RED_2 changes the synchronized output signal SYNCOUT_2 to a high level, thereby notifying the operation control unit 32 of the ADC 11 that the ADC 12 is ready for the AD conversion.

Thereafter, when both the synchronized output signal SYNCOUT_1 and the synchronized output signal SYNCOUT_2 are changed to a high level, the operation control unit 32 of each of the ADC 11 and the ADC 12 instructs its event management unit 31 and its execution control unit 33 to execute the AD conversion by changing the execution signal EXE to a high level. Accordingly, the operation control unit 32 of the ADC 11 waits until the ADC 12 is ready. Thus, the start time for the AD conversion of the ADC 11 and the ADC 12 is controlled at the same hour.

Although this embodiment describes the example of providing the two ADC 11 and 12, this embodiment is readily applicable to a case of providing three or more ADC as well by conducting an OR operation of the synchronized output signals SYNCOUT outputted from all of the ADC and changing the execution signals EXE to a high level accordingly.

Figure 5:
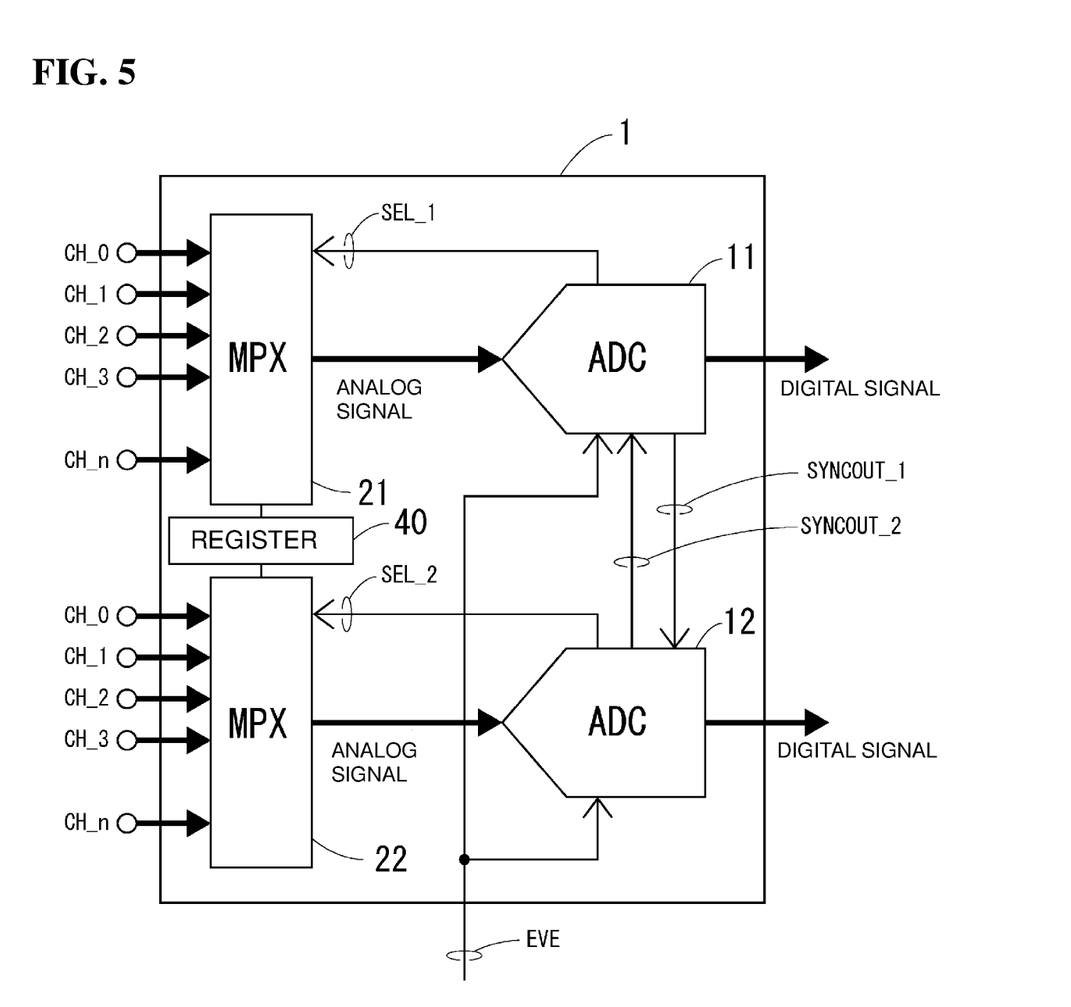
FIG. 5 is a diagram illustrating a circuit configuration of an AD conversion device according to one or more embodiments.

Moreover, a register 40 that changes codes (channels) unique to the analog inputs CH_0 to CH_n connected to the MPX 21 and 22 by setting may be provided as illustrated in FIG. 5. The ADC 11 and 12 change the analog inputs CH by designating a channel for the selection signal SEL. Accordingly, the configuration that allows the change of the unique codes (the cannels) by the setting of the register 40 makes it possible to modify the correspondence of the events to the analog inputs CH_0 to CH_n without changing the connection of the analog inputs CH_0 to CH_n.

For example, in the case of an event to perform the AD conversion in the order of analog inputs CH_a to CH_d that have channels of "00", "01", "10", and "11", respectively, the order of the AD conversion is modified to the order of the along inputs CH_d to CH_a by setting the register 40 to transpose numerals "0" and "1" in the channels.

As described above, according to this embodiment, the AD conversion device 1 includes the AD converters (the ADC 11 and 12) each of which performs the AD conversion of an inputted analog signal into a digital signal, where each of the ADC 11 and 12 independently executes an event instructed by a host device. Here, each of the ADC 11 and 12 includes: the execution control unit 33 that controls execution of the AD conversion; the event management unit 31 that notifies of a synchronization instruction by changing the synchronization instruction signal SYNC to a high level when the synchronous conversion operation (the event "0") set up with the synchronous conversion operation is instructed as the event; and the operation control unit 32 that notifies the counterpart ADC 12 or 11 that the ADC 11 or 12 is ready for the AD conversion by changing any of the synchronized output signal SYNCOUT_1 and the synchronized output signal SYNCOUT_2 to a high level when the synchronization instruction is notified and the execution control unit 33 is confirmed ready for the AD conversion, and instructs the execution control unit 33 to execute the event "0" after all of the ADC 11 and 12 are confirmed ready for the AD conversion based on the changes of both the synchronized output signal SYNCOUT_1 and the synchronized output signal SYNCOUT_2 to a high level.

This configuration allows each of the ADC 11 and 12 to confirm that the counterpart ADC 12 or 11 is ready for the AD conversion by use of the synchronized output signal SYNCOUT_1 and the synchronized output signal SYNCOUT_2. Accordingly, it is possible to perform synchronous control of the ADC 11 and 12 independently of the host device and without imposing a burden on the host device.

Moreover, according to this embodiment, in the state where the synchronization instruction is not notified due to the reason that the event is not the event "0", and when the operation control unit 32 confirms that the execution control unit 33 is ready for the AD conversion, the operation control unit 32 instructs the execution control unit 33 to execute the event without notifying the counterpart ADC 12 or 11 that the ADC 11 or 12 is ready for the AD conversion.

This configuration makes it possible to switch between the synchronous conversion operation and the independent operation by using the synchronization instruction signal SYNC (the synchronization instruction).

Furthermore, according to this embodiment, the event "0" is set as the top priority among all of the events. Therefore, the event management unit 31 executes the event "0" on a priority basis when two or more events including the event "0" are in a standby state.

This configuration makes it possible to execute the synchronous conversion event set with the synchronous conversion operation easily on a priority basis, and thus to minimize waiting time for the synchronous conversion operation.

It is necessary to perform AD conversion of two or more analog signals at the same hour in order to perform control calculation of a power supply circuit. For this reason, the related art provides as many AD converters as the analog signal inputs to be subjected to the AD conversion at the same hour. In this case, however, the host device has to perform synchronous control of the AD converters, which is burdensome to the host device.

According to the one or more embodiments described above, each of the AD converters can confirm that the counterpart AD converter or converters are ready. This makes it possible to perform the synchronous control of the AD converters independently of the host device and without placing a burden on the host device.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

The invention claimed is:

1. An analog-to-digital conversion device that independently executes each of events instructed by a host device, comprising:
   at least two analog-to-digital converters that convert an inputted analog signal into a digital signal, wherein each of the analog-to-digital converters independently executes an event instructed by the host device, wherein each of the analog-to-digital converters comprises:
      an execution control unit that controls execution of the analog-to-digital conversion;
      an event management unit that notifies of a synchronization instruction when a synchronous conversion event set up with a synchronous conversion operation is instructed as the event; and an operation control unit that makes a notification to the analog-to-digital converters, and instructs the execution control unit to execute the synchronous conversion event, wherein when a particular one of the analog-to-digital converters receives the synchronization instruction and the execution control unit of the particular analog-to-digital converter is confirmed ready for the analog-to-digital conversion, the operation control unit in the particular analog-to-digital converter notifies the particular analog-to-digital converter is ready for the analog-to-digital conversion to the analog-to-digital converter other than the particular analog-to-digital converter, and instructs the execution control unit to execute the synchronous conversion event after a confirmation that all of the analog-to-digital converters are ready for the analog-to-digital conversion.

2. The analog-to-digital conversion device of claim 1, wherein in a state where the synchronization instruction is not notified due to a reason that the event is not the synchronous conversion event, when the operation control unit of the particular analog-to-digital converter confirms that the execution control unit of the particular analog-to-digital converter is ready for the analog-to-digital conversion, the operation control unit instructs the execution control unit to execute the event without notifying the other analog-to-digital converter that the particular analog-to-digital converter is ready for the analog-to-digital conversion.

3. The analog-to-digital conversion device of claim 1, wherein the synchronous conversion event is set as a top priority among all of the events, and the event management unit executes the synchronous conversion event on a priority basis when events including the synchronous conversion event are in a standby state.

4. An analog-to-digital conversion device that independently executes each of events instructed by a host device, comprising:

a plurality of analog-to-digital converters comprising at least a first and a second analog-to-digital convertors that convert an inputted analog signal into a digital signal, wherein each of the analog-to-digital converters independently executes an event instructed by the host device, wherein each of the analog-to-digital converters comprises:

an execution control unit that controls execution of the analog-to-digital conversion;

an event management unit that notifies of a synchronization instruction when a synchronous conversion event set up with a synchronous conversion operation is instructed as the event; and an operation control unit that makes a notification to the analog-to-digital converters, and instructs the execution control unit to execute the synchronous conversion event, wherein when the first analog-to-digital converters receives the synchronization instruction and the execution control unit of the first analog-to-digital converter is confirmed ready for the analog-to-digital conversion, the operation control unit in the first analog-to-digital converter notifies the first analog-to-digital converter is ready for the analog-to-digital conversion to at least the second analog-to-digital converter, and instructs the execution control unit to execute the synchronous conversion event after a confirmation that the plurality of analog-to-digital converters are ready for the analog-to-digital conversion.

* * * * *